United States Patent [19]

D'Luna

[11] Patent Number: 5,058,065
[45] Date of Patent: Oct. 15, 1991

[54] MEMORY BASED LINE-DELAY ARCHITECTURE

[75] Inventor: Lionel J. D'Luna, Rochester, N.Y.

[73] Assignee: Eastman Kodak Company, Rochester, N.Y.

[21] Appl. No.: 488,824

[22] Filed: Feb. 26, 1990

[51] Int. Cl.$^5$ .................. G11C 7/00; G11C 19/00
[52] U.S. Cl. ................. 365/189.02; 365/194; 365/189.12; 340/800; 340/802
[58] Field of Search ............ 365/194, 189.12, 239, 365/240, 189.02; 340/800, 802, 799

[56] References Cited

U.S. PATENT DOCUMENTS

| | | | |
|---|---|---|---|
| 4,237,547 | 12/1980 | Smith | 365/230.06 |
| 4,321,695 | 3/1982 | Redwine et al. | 365/174 |
| 4,648,077 | 3/1987 | Pinkham et al. | 365/194 |
| 4,691,302 | 9/1987 | Mattausch | 365/194 |
| 4,740,924 | 4/1988 | Tielert | 365/194 |
| 4,748,595 | 5/1988 | Mattausch | 365/194 |
| 4,782,247 | 11/1988 | Yoshida | 307/449 |
| 4,794,559 | 12/1988 | Greenberger | 365/49 |
| 4,803,663 | 2/1989 | Miyamoto et al. | 365/205 |
| 4,876,670 | 10/1989 | Nakabayashi et al. | 365/240 |

OTHER PUBLICATIONS

Mattausch et al., A Memory-Based High-Speed Digital Delay Line With a Large Adjustable Length, IEEE Journal of Solid-State Circuits, vol. 23, No. 1, Feb. 1988, pp. 105-110.

Ruetz et al., Architectures and Design Technique for Real-Time Image-Processing IC's, IEEE Journal of Solid-State Circuits, vol. sc-22, No. 2, Apr. 1987, pp. 233-250.

Zehner et al., A CMOS VLSI Chip for Filtering of TV Pictures in Two Dimensions, IEEE Journal of Solid-State Circuits, vol. sc-21, No. 5, Oct. 1986, pp. 797-802.

Primary Examiner—Glenn Gossage
Attorney, Agent, or Firm—Parkhurst Wendel & Rossi

[57] ABSTRACT

A digital line delay architecture is provided that requires a minimum of chip space, has low power requirements, is variable or programmable in length, and is flexible to permit changes in aspect ratio. The digital line delay architecture is self-multiplexing and therefore requires no external addressing for the multiplexing function, and is particularly suited for use as a video line delay in a single chip digital image processing device. In particular, a pointer unit is employed to sequentially address a plurality of word storage locations provided in a storage unit. The pointer unit includes a number of shift-registers that sequentially shift a logic "1" along the length of the pointer unit to accomplish the addressing.

9 Claims, 7 Drawing Sheets

MEMORY BASED LINE-DELAY ARCHITECTURE

BACKGROUND OF THE INVENTION

The present invention is generally related to digital line delays. In particular, the present invention is related to a digital line delay based on a read/write memory structure that can be utilized as a video line delay in digital image processing circuitry.

Many digital image processing techniques require that multiple lines of image data be simultaneously available in order to perform various convolution operations such as interpolation, filtering and enhancement. Accordingly, a video line delay device must be utilized to provide delayed image data in order to accomplish the desired image processing. A video line delay device can generally be described as a sequential access device in which current pixel data is input and delayed pixel data is output. Sequential access can be accomplished either by configuring the video line delay as a sequentially addressed read/write memory or by using shift registers to shift pixel data from one register to the next until the pixel data is output after the desired delay time has been reached.

Recent advances in VLSI technology has led to the capability of integrating whole digital signal processing (DSP) systems on a single chip. It would be desirable to apply VLSI technology to integrate the circuitry required to accomplish digital image processing (including a video line delay) into a single chip that could be easily incorporated within the body of electronic still-/motion video cameras or other electronic imaging devices. Camera applications, in particular, necessitate low power and space requirements for the digital image processing circuitry. The space criterion, together with the fact that DSP real-time systems are pipelined, dictates the use of dynamic rather than static logic for the video line delay architecture, as in general, more transistors per cell are required for static logic designs. The low power requirement also suggests the use of DRAM architecture rather than dynamic shift-registers, as DRAM architecture only requires that the addressing circuits be switched each cycle, whereas each element or pixel cell would have to be switched in a shift-register architecture.

Another disadvantage of a shift-register video line delay is that variable or programmable delay lengths are not practically feasible, as the output of all the registers would have to be multiplexed to the output of the video line delay. The requirement for a variable or programmable delay length is desirable in order to create a video line delay that can be utilized in cameras operating at different video standards such as National Television Standards Committee (NTSC), Phase-Alternation Line (PAL) and International Radio Consultive Committee (CCIR) and with different size image sensors. The CCIR standard requires a line length of 720 pixels with a 13.5 MHz pixel rate. The NTSC and PAL standards can use a lesser or greater number of pixels per line at slower or faster rates. For example, the NTSC standard can use 570 active pixels per line. Thus, it would be desirable to provide a video line delay that could be programmed to operate in conjunction with a variety of video standards.

While the above-described requirements for size, low power consumption and variable delay length would appear to lead to the use of DRAM architecture for video line delays, conventional DRAM architectures are not particularly suited for implementation as video line delays. For example, most memory devices require some form of address decoding and multiplexing of the bit lines to output data as shown in FIG. 1. For a READ operation to occur in the illustrated example, the upper six address bits (a2 to a7) are decoded by a word-line decoder to enable the word lines that evaluate the four memory cells which respectively correspond to the same bit (for example bit 0) of four different words. The lowest two address bits (a0, a1) are decoded to control a 4:1 multiplexer that selects one of the four memory cells. A counter must be used to provide the sequential access. The use of the multiplexer which requires address decoding and a counter adversely effects the amount of power and chip space required for the architecture.

In view of the above, the object of the present invention is to provide a video line delay architecture that requires a minimum of chip space, has low power requirements, is variable or programmable in length, and is flexible to permit changes in aspect ratio. In addition, the present invention is directed toward providing a memory based line delay architecture that is "Self-Multiplexing", i.e., does not require address decoding or external control signals as in conventional memory devices.

SUMMARY OF THE INVENTION

The present invention provides a digital line delay architecture that requires a minimum of chip space, has low power requirements, is variable in length, and is flexible to permit changes in aspect ratio. The digital line delay architecture is self-multiplexing and therefore requires no external addressing for the multiplexing function. The digital line delay architecture is particular suited for use as a video line delay in a single chip digital image processing device.

More specifically, the present invention provides a digital line delay architecture that includes: a storage unit having at least one line store including a plurality of word storage locations (n), each of the word storage locations including a plurality of memory cells, wherein corresponding memory cells from each of the word storage locations are connected to common input lines of the line store and common output lines of the line store, and each of the word storage locations includes a write enable line and a read enable line connected to the memory cells within each of the word storage locations; and a pointer unit including a plurality of shift-registers (n+1) having input lines and output lines, wherein the input line of a first shift-register of the plurality of shift-registers is connected to a control input line and the output of the first shift-register is connected to the read enable line of a first word storage location of the plurality of word storage locations, the output line of a last shift-register of the plurality of shift-registers is connected to the write enable line of a last word storage location, and shift-registers intermediate between the first shift-register and the last shift-register are connected such that the output line of a preceding shift register is connected to the input line of a successive shift-register and the output of each intermediate shift register (i) is connected to the read enable line of a corresponding word storage location (i) and to the write enable line of word storage location (i−1) preceding the corresponding word storage location.

As set forth in greater detail below, the basic architecture described above can be expanded to provide any number of line delay outputs by increasing the number of line stores provided, commonly connecting the read and write operation control lines of corresponding word storage from each line store, and connecting the common input lines of a given line store to the common output lines of a preceding line store.

The aspect ratio of the line delay architecture is also readily varied by arranging the word storage locations of the line stores in a plurality of columns, connecting the corresponding memory cells from word storage locations within a given column to common column output lines, and connecting the corresponding column output lines from each of the plurality of columns to a multiplexing unit.

Self-multiplexing is accomplished by utilizing multi-input logic gates in the multiplexing unit that are coupled to corresponding column output lines. Thus, the output of the logic gates, and hence the multiplexing function, is controlled solely by the data stored in the word storage locations and is presented to the logic gates via the column output lines. In a preferred embodiment, the logic gates employed in the multiplexing unit are multi-input NAND gates.

BRIEF DESCRIPTION OF THE DRAWINGS

With the above as background, reference should now be made to the following detailed description of the preferred embodiments and the accompanying drawings in which.

DETAILED DESCRIPTION OF THE PREFERRED EMBODIMENTS

Figure 1:
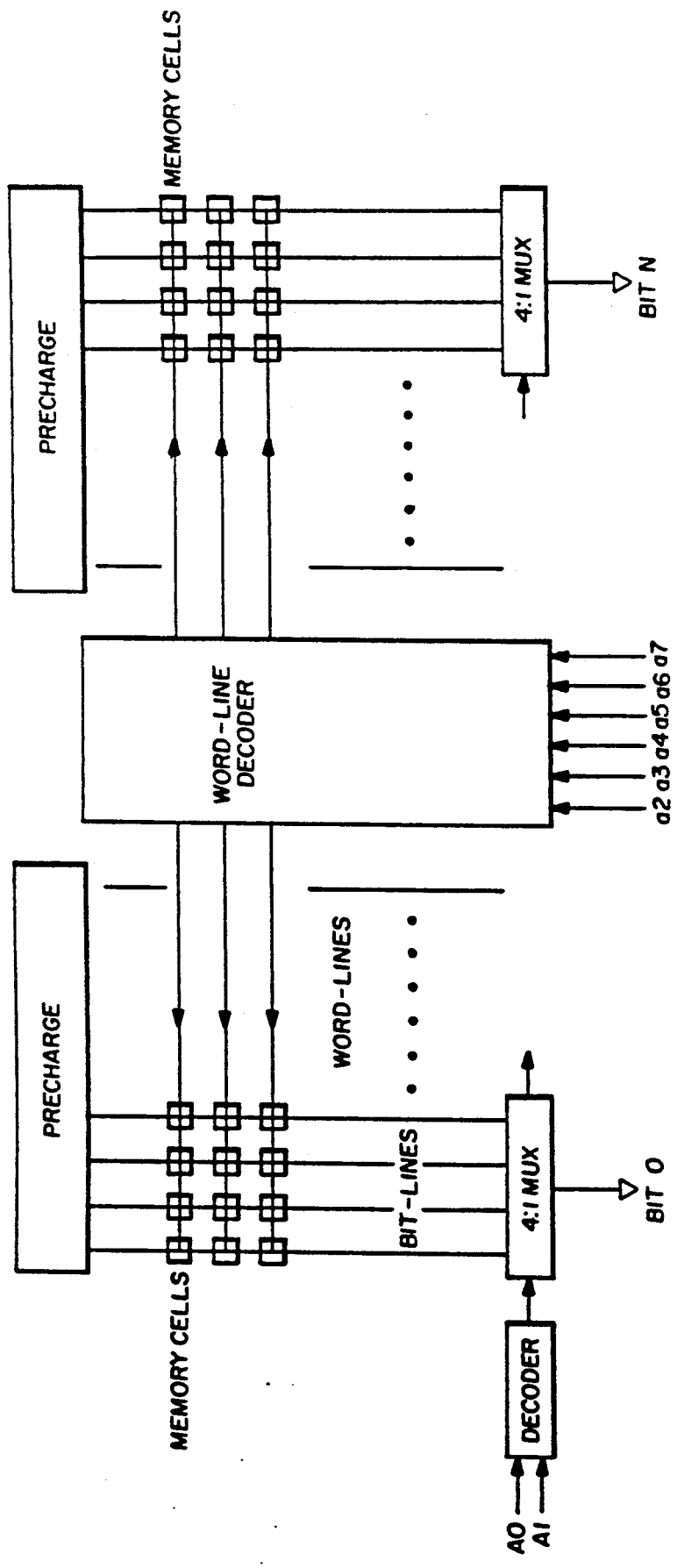
FIG. 1 illustrates a conventional architecture for a memory device.
Figure 2:
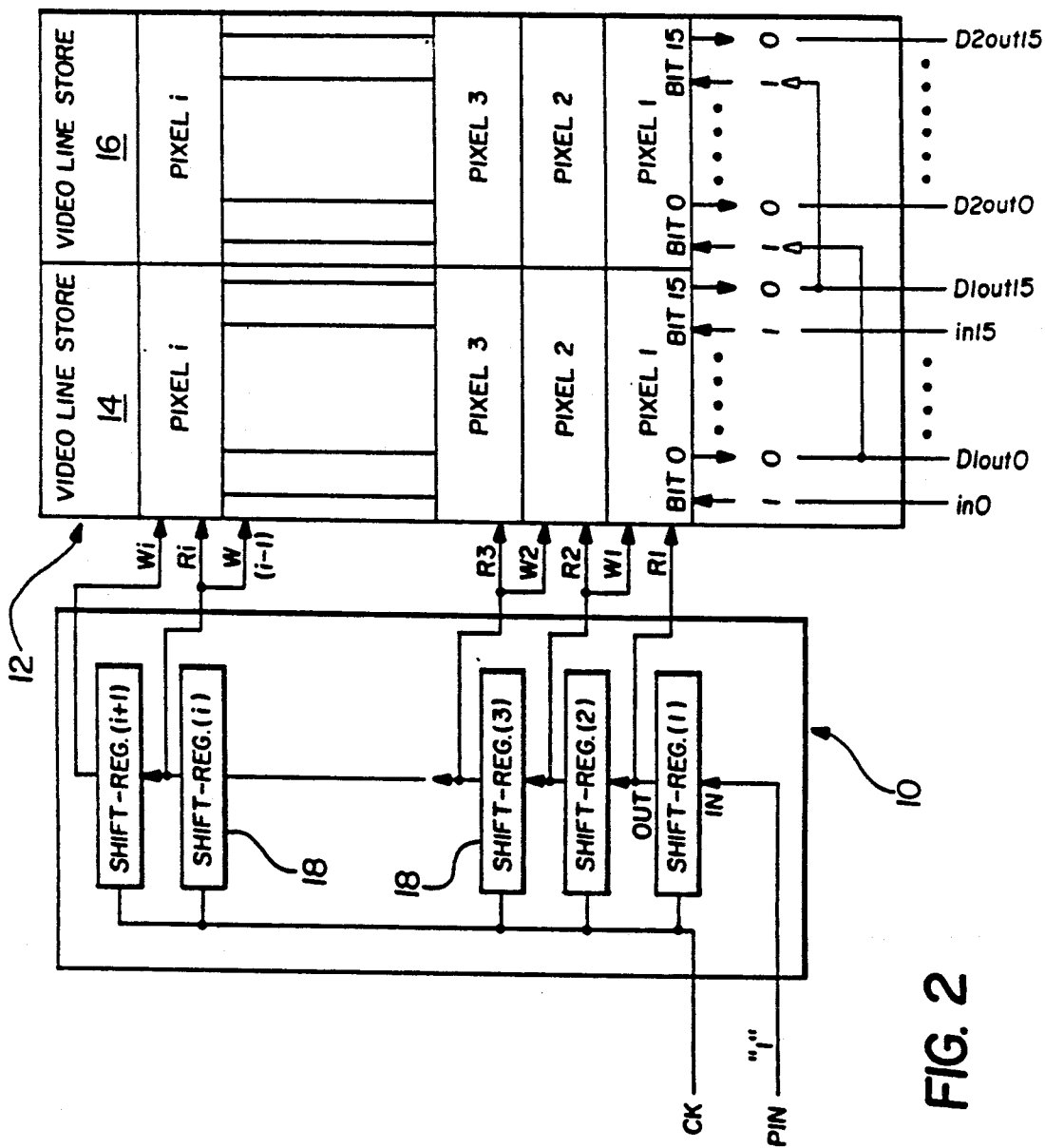
FIG. 2 is a simplified block diagram of a dual line delay in accordance with the present invention.

A simplified block diagram of a first embodiment of the invention is illustrated in FIG. 2. A dual line delay is shown having a pointer unit 10 and a storage unit 12. The storage unit 12 includes a first video line store 14 and a second video line store 16, each of which has a plurality of pixel storage locations (pixels 1 to i). Each pixel storage location includes sixteen memory cells in the illustrated embodiment. Each pixel storage location is used to store one data word representative of one image pixel, with each memory cell storing one bit of image information. A separate read enable (R) and write enable (W) line is supplied to common pixel storage locations within each of the video line stores 14 and 16, i.e., the read enable line connected to the first pixel storage location (pixel 1) in the first video line store 14 is also connected to the first pixel storage location (pixel 1) of the second video line store 16. The read enable lines and write enable lines address each of the memory cells within a given pixel storage location. Separate input (I) and output (0) data-bit lines are provided for the first and second video line stores 14 and 16 as illustrated. The input and output data-bit lines are common to corresponding memory cells within a given video line store. For example, D1OUT0 is connected to the lowest order memory cell in each pixel storage location of video line store 14. The output bit-lines from the first video line store 14 are coupled to the input bit-lines of the second video line store 16.

The pointer unit 10 consists of a plurality of one bit shift-registers 18 and is used to sequentially address the pixel storage locations of the first and second video line stores 14 and 16. Each of the bit shift-registers 18 includes an input line and an output line. The input line of a first shift-register (1) of the plurality of shift-registers 18 is connected to a control input line (PIN), which will be described in greater detail below, and the output of the first shift-register (1) is connected to the read enable line (R1) of a first word storage location (pixel 1) of the plurality of word storage locations, the output line of a last shift-register (i+1) of the plurality of shift-registers is connected to the write enable line (Wi) of a last word storage location (pixel i), and shift-registers intermediate between the first shift-register and the last shift-register—shift-registers (2) through (i)—are connected such that the output line of a preceding shift register is connected to the input line of a successive shift-register and the output of each intermediate shift register is connected to the read enable line of a corresponding word storage location and to the write enable line of word storage location preceding the corresponding word storage location.

In operation, pixel data is sequentially stored in the pixel storage locations of the first video line store 14 via input data lines IN0–IN15. The data is then sequentially read or sensed from the first video line store 14 using output lines D1OUT0-D1OUT15. The data sensed from the first video line store 14 is one-line delayed from the input data. The sensed data from the first video line store 14 is supplied as input data to the second video line store 16, as the output lines of the first video line store 14 are coupled to the input lines of the second video line store 16. Thus, the data sensed from the video line store 16 is D2OUT0-15 is two line delayed data from the input data. Simultaneous with this operation, new input data is stored in the line store 14.

A more detailed explanation will be provided using the following notation: PiL1 is the ith pixel storage location of the first video line store 14, where i=1-720; similarly, PiL2 is the ith pixel storage location of the second video line store 16; the input data is denoted by Ii; and Rn and Wn indicate particular read and write operations (the particular number of pixel storage locations can of course vary depending on the application). The sequence of read and write operations is set forth below. At the beginning of operation, the data present in the pixel storage locations, P1L1 and P1L2, is read from both the first and second video line stores 14 and 16 (R1,W0) and supplied to D1OUT and D2OUT. At the next clock cycle new data, I1, is written into P1L1 as the data that was present in P1L1 is simultaneously written to P1L2, and the data at locations P2L1 and P2L2 are read out from both the first and second video line stores 14 and 16 (R2,W1) and supplied to D1OUT and D2OUT. The simultaneous reading of a pixel storage location and writing of a previous pixel storage location continues until the end of the line is reached. At that point, the last new pixel value, I720, has to be written (W720) into P720L1, and data present in P720L1 that was read with R720 must be written into P720L2. The read/write sequence is therefore: (R1), (R2,W1), (R3,W2)...(R720,W719), (W720). The above described sequence is repeated line after line.

A start pulse, PIN, is supplied at the start of the operating sequence. The PIN pulse is a logical "1" that gets loaded into the pointer unit 10 and is shifted along the length of pointer unit 10 by the application of a clocking signal (CK). The output of one and only one shift-register 18 is a "1" during any clock cycle and the output from the remaining shift-registers 18 is a logical "0" insuring that only one row of the storage unit 12 is being read and only one previous row is being written. in effect, the "travelling" logic "1" moves along the length of the pointer unit 10 to sequentially address the pixel storage locations in the storage unit 12.

Figure 3:
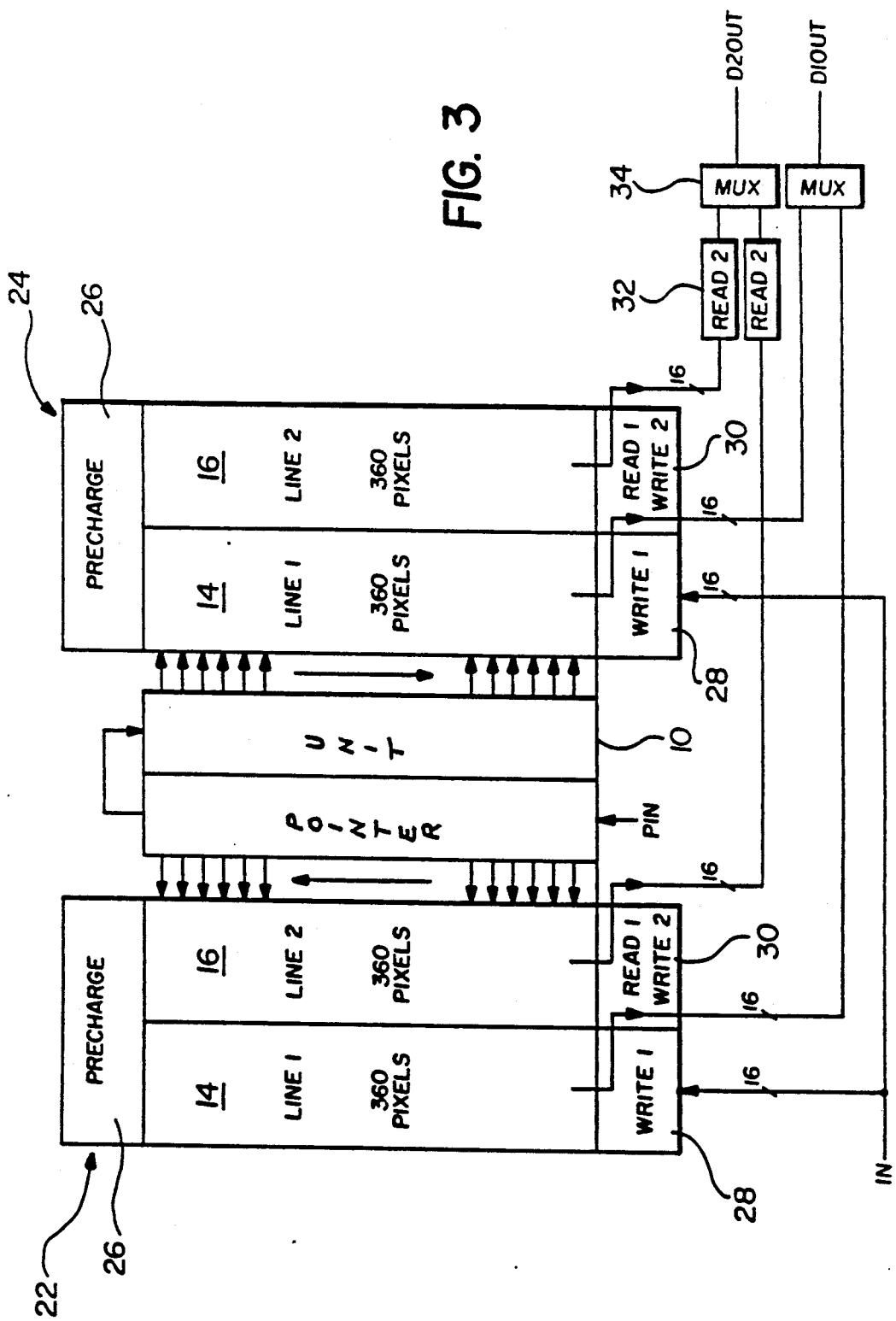
FIG. 3 illustrates a schematic block diagram of a second embodiment of the dual line delay in accordance with the present invention.

FIG. 3 illustrates a schematic block diagram of a second embodiment of the dual line delay (like components being similarly denoted) in which the storage unit 12 is split into two halves or columns 22 and 24. The pointer unit 10 is located between the columns 22 and 24 of the storage unit 12. The travelling "1" starts with the PIN pulse and moves up addressing the left column 22 of the storage unit 12 until it reaches the top, and then turns around and comes down addressing the right column 24 of the storage unit 12, as the 721 element long pointer unit 10 is essentially folded over on itself at the top. Precharge circuitry 26 is located at the top of columns 22 and 24. Data-read (sense)/data-write circuitry is located at the bottom of the columns 22 and 24. WRITE1 circuitry 28 is provided to latch the input data (IN) and write it onto the input bit-lines of first video line store 14 at the appropriate times. READ1/WRITE2 circuitry 30 is provided to sense the data on the output bit-line of the first video line store 14, latch it to the output at D1OUT, and write it back onto the input bit-lines of the second video line store 16. READ2 circuitry 32 is provided to sense the data on the output bit-lines of the second video line delay 16 and latch it to the output at D2OUT. As will be described in greater detail below, the output bit-lines from columns 22 and 24 corresponding to a given video line store must be multiplexed by MUX units 34, as the corresponding bit in both columns of the storage unit 12 must ultimately be presented on a single output pin for the dual line delay as a whole.

Two important factors are addressed by splitting the memory unit 12 into two columns. The first factor is related to the problem of providing a line delay that can be incorporated on a single chip. The length of a storage unit to accommodate 720 pixels of image information would not be practical to integrate along with other digital processing circuitry in a single chip due to layout considerations. Further, a single 720 element bit-line presents a very large capacitance that needs to be precharged and discharged within one clock cycle. The bit-line capacitance is essentially cut in half at the expense of some additional pre-charge circuitry, read/write circuitry and the provision of MUX units 34. The multiplexing can be accomplished quite easily as compared with conventional devices, however, by implementing the multiplexing function with the use of NAND gates which do not require external addressing as will be described further below.

Figure 4:
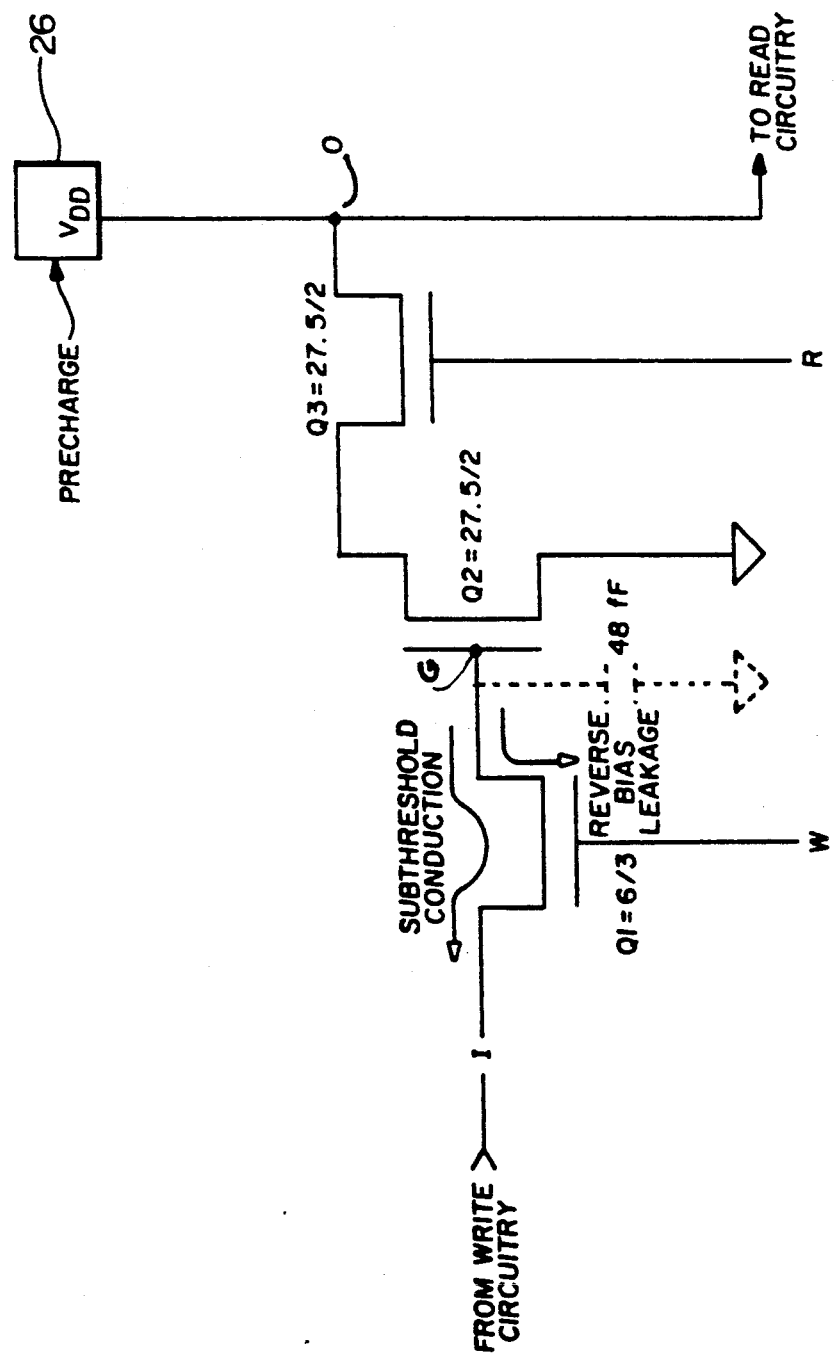
FIG. 4 illustrates a three-transistor DRAM cell employed in the embodiments illustrated in FIGS. 2 and 3.

As mentioned above, each of the pixel storage locations include a plurality of memory cells. Preferably, the memory cells are formed of a three-transistor DRAM cell with separate data-in (I), data-out (0), read (R), and write (W) lines as illustrated in FIG. 4. The data-out line is connected to the pre-charge circuitry 26. The storage node for the memory cell is the gate (G) transistor Q2. The data present on the data-in line (I) is stored on the gate of Q2 when the write line W is asserted. The data-out line (0) is precharged high (logic "1") and is evaluated when the read line R is asserted. If a "1" was stored on the gate of Q2, the data-out line gets discharged through Q2 and Q3 to ground (GND), whereas if a "0" was stored the data-out line remains high.

Figure 5:
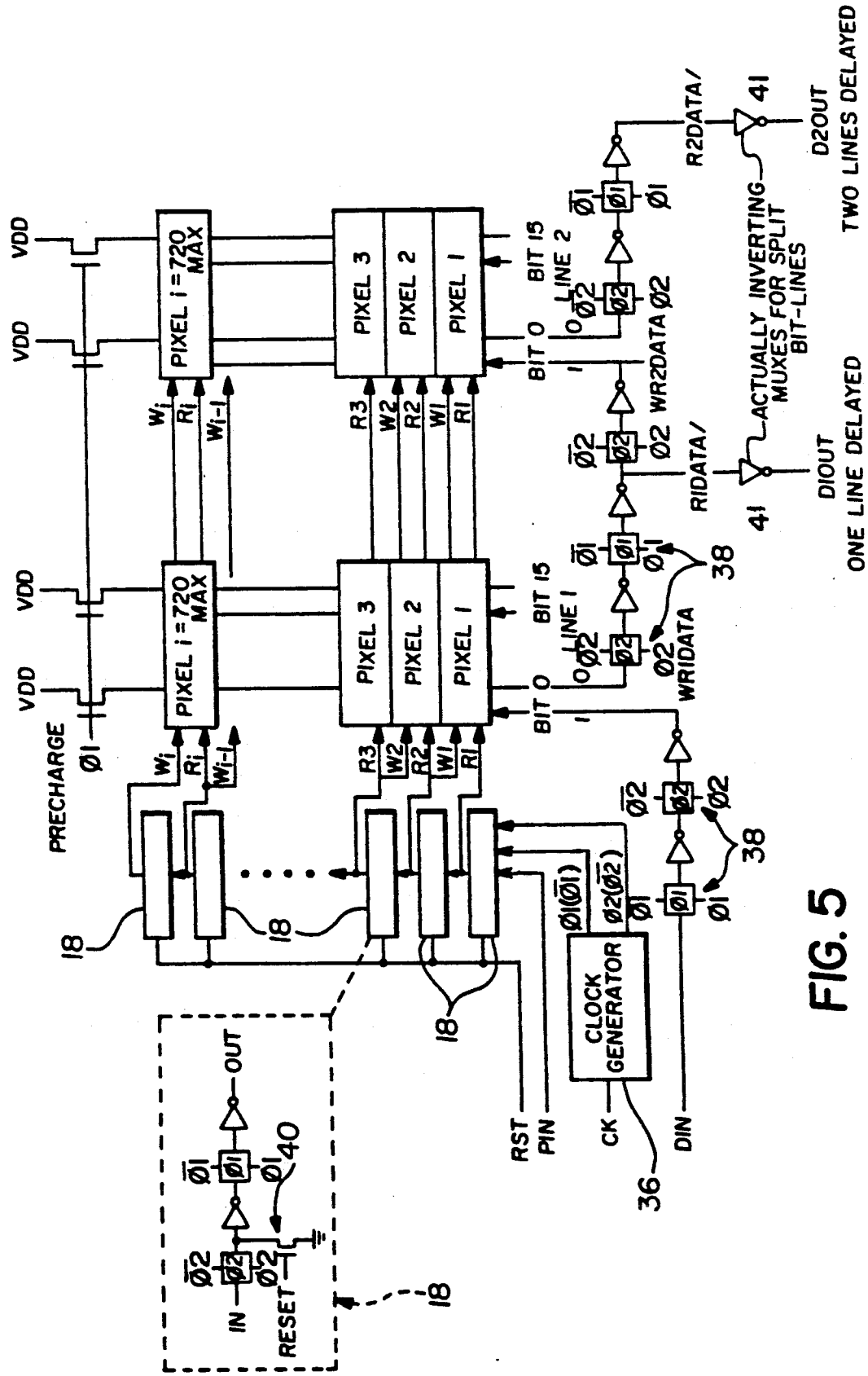
FIG. 5 is a detailed schematic diagram of the embodiment illustrated in FIG. 2.

The operation of the dual line delay is fully synchronous. A two-phase non-overlapping clock is employed which permits master/slave latching and precharge/evaluate to take place on alternating phases, so that each basic operation is controlled by a clock phase. FIG. 5 is a more detailed schematic diagram of the embodiment illustrated in FIG. 2, and shows a clock generator 36 that is employed to generate $\phi 1$ and $\phi 2$ clock pulses as well as their complements $\overline{\phi 1}$ and $\overline{\phi 2}$ since CMOS transmission gates 38 (a transmission) gate labeled with $\phi 1$ for example, indicates it is open (i.e. conducting thereby permitting a signal to pass through) when $\phi 1$ is high and closed (i.e. not conducting thereby preventing a signal to pass through) when $\phi 1$ is low) are employed in the structure of the shift registers 18, WRITE1 circuitry 28, READ1/WRITE2 circuitry 30 and READ 2 circuitry 32.

FIG. 5 also schematically illustrates the internal structure of a shift register 18. A reset transistor 40 is provided to reset the output of the shift register 18 to a logical "0". The provision of the reset transistor 40 permits the traveling "1" to be wiped out from the pointer unit 10 at any point along the length of the pointer unit. Thus, it is possible to vary the length of the delay provided by activating the reset line (RST), thereby resetting the operation of the dual line delay for the next line of data.

The basic clocking operation begins at the start of a video line with PIN going high for one clock cycle. As mentioned above, this traveling "1" then moves through the length of the pointer unit 10 sequentially. As previously described, only one shift register output is a "1" at a given time. The shift register outputs change on the rising edge of the clock i.e., $\phi 1$ phase. During the $\phi 1$ phase the data-out lines are also precharged. The data-out lines are evaluated during the $\phi 2$ phase. Since the pointer outputs are valid during the pre-charge phase, a path between Vdd and Gnd is established (See FIG. 4) if a "1" was stored in the cell whose read line R is being accessed. This increases the power consumption but ensures high speed operation as the data-out line never gets pulled all the way up, and as a result discharges more quickly.

Figure 6:
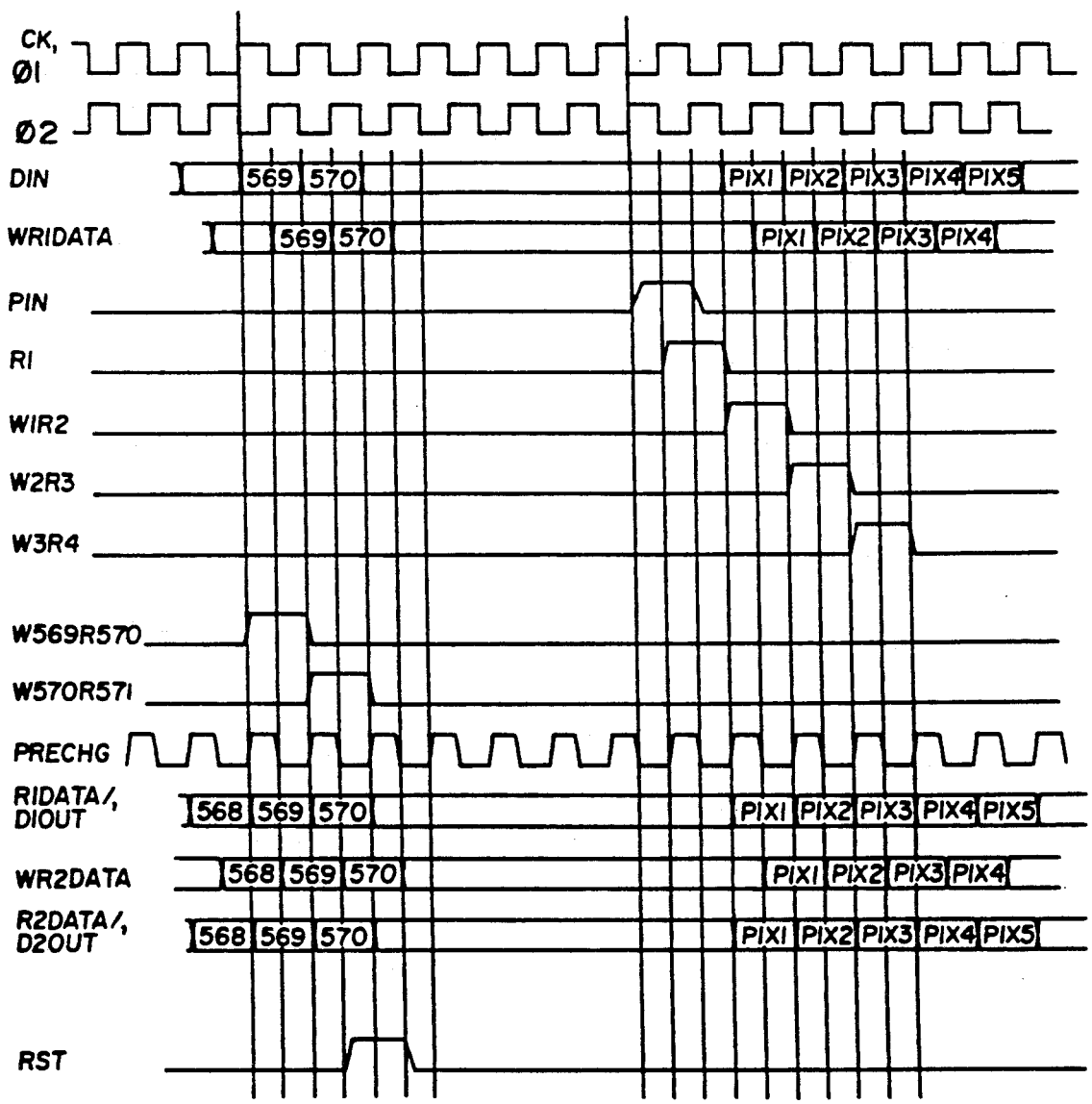
FIG. 6 is a comprehensive timing diagram for the dual line delay illustrated in FIG. 5.

A comprehensive timing diagram for the dual line delay illustrated in FIG. 5 is shown in FIG. 6. This diagram shows data and clock phase relationships and requirements in a qualitative manner. The control signals are the pointer start, PIN, and the pointer reset, RST. The RST is shown when using the dual line delay as a 570 pixel delay. The PIN, RST, and DIN signals must all be referenced to the master input clock CK. DIN is latched during $\phi 1$ hence it must be valid before the falling edge of CK. PIN is latched by the pointer during $\phi 2$, hence it must be valid before the rising edge of CK. The RST to the pointer is actually effective only after $\phi 1$ goes high, hence it can be asserted either before or just after the rising edge of CK. Although it is shown straddling the rising edge of CK, its effect takes place only after the rising edge. What is important is that RST must be high during most of φ1 of the appropriate clock cycle. The signals R1, W1R2, W2R3, etc. are for the read and write operations described above based on the addressing sequence established by the pointer unit 10.

The phase sequence illustrated in FIG. 5 permits the dual line delay to take data that is valid before the falling edge of the clock and to output one-line delayed and two-lined delayed data during the same clock cycle. It should be noted that the D1OUT and D2OUT data is inverted from that which is sensed on the output bit-lines, as the output bit-line gets discharged to ground if a "1" is stored in the pixel storage cell. The output must reflect what was stored in the cell thereby requiring that inverters 41 be employed. The inverting function is performed by the MUX units 34 in the embodiment illustrated in FIG. 3.

Figure 7:
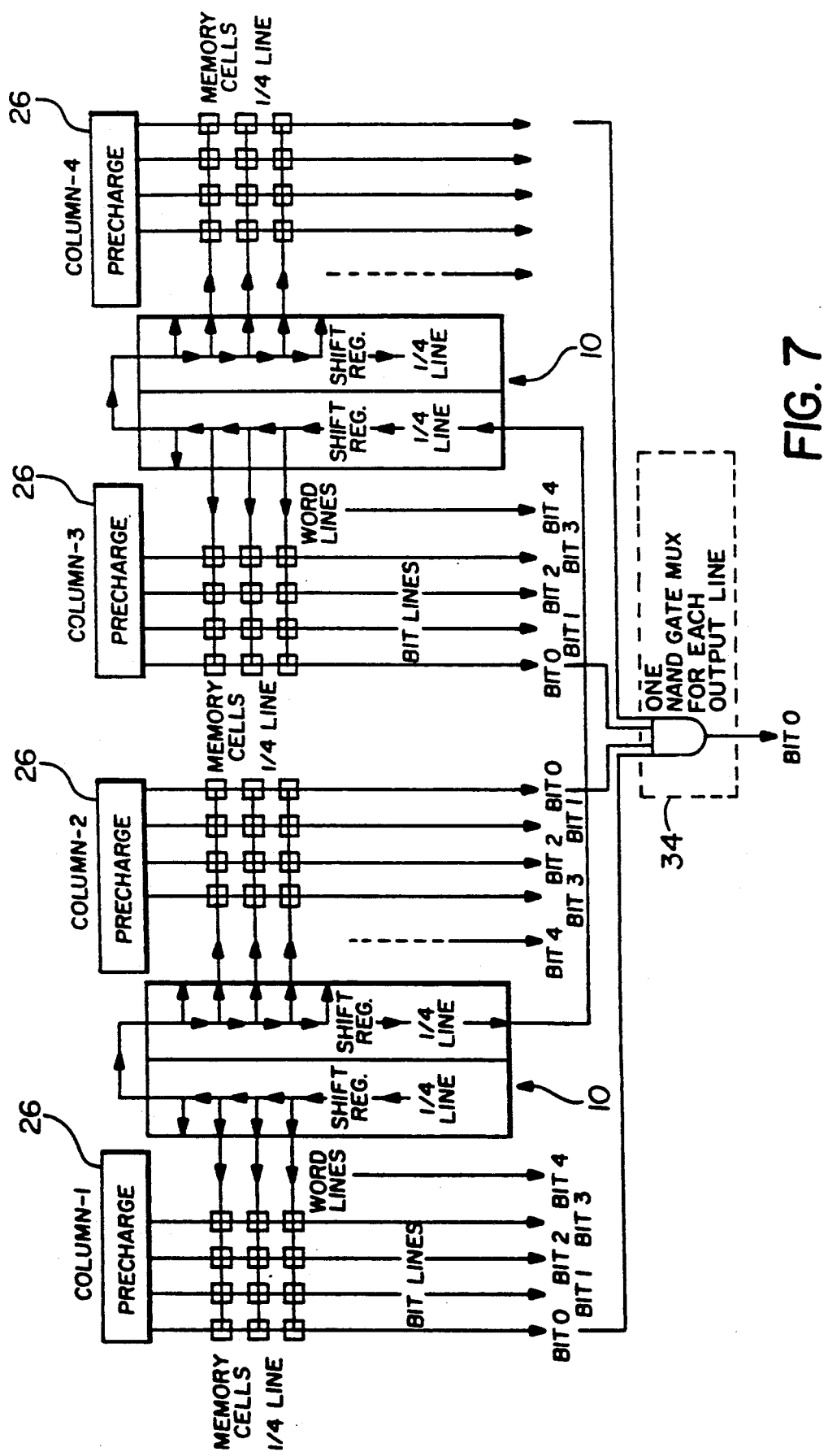
FIG. 7 illustrates a third embodiment of the invention incorporating a storage unit divided into four columns.

The self-multiplexing operation of the MUX units 34 will be described in greater detail with reference to FIG. 7 which illustrates a third embodiment of the invention. The third embodiment is a single line delay in which the storage unit 12 is divided into four columns each column being ¼ the total line length) as opposed to the two columns illustrated in FIG. 3. As noted above, multiplexing of the bit lines must be provided; however, no address lines are provided as in conventional memory devices to control the operation of the MUX units 34. Instead, the output of the MUX units 34 is controlled based on the values stored in the memory cells. Thus, external control signals do not need to be supplied to the line delay in order to accomplish the multiplexing operation.

For example, the pointer unit 10 reads only one row of memory cells of one column depending on where the travelling "1" is located within the pointer unit 10. The row addressed by the pointer unit 10 can be in any of the four columns of the storage unit 12 of FIG. 2. If the travelling "1" is in the first column, the corresponding bit-lines in the second, third and fourth columns will remain precharged after the pre-charge cycle, independent of the data stored on the cell, since the read line is not being asserted in those columns. The corresponding bit-line in the first column will be discharged if a "1" was stored in the accessed cell and will remain precharged if a "0" was stored. If the bit-line gets discharged (indicative of a "1" being stored) the output of the line delay should show a "1" and if the bit-line remains pre-charged the output of the line delay should show a "0". Accordingly, a logical NAND operation must be performed between the corresponding bit-lines of the four columns. Hence, the multiplexer unit 34 can be implemented as a simple four-input NAND gate as illustrated.

It will be recognized by those skilled in the art that the basic concept of utilizing a pointer unit to address the pixel storage locations and the self-multiplexing described above provides a wide degree of latitude in laying out the storage unit. In other words, the storage unit can be divided into any desired number of columns of any desired length, thereby enabling the aspect ratio of the line delay to be readily varied to match the design requirements for single chip integration.

The invention has been described with particular reference to preferred embodiments thereof. It will be understood, however, that modifications and variations can be made within the spirit and scope of the appended claims. For example, the expansion of the basic principles set forth above to three, four, five, etc. line delays would simply be a matter of expanding the size of the storage unit to include additional video line store sections as detailed above, and connecting the video line store sections such that the output of the lower order section is provided as the input to the higher order section. Further, the basic one and two line delays described above (720 pixels long and 16 bits wide) can be configured as a two-channel one or two line delay (720×8), a one line delay 1440×16 by using only the D2OUT output, a two-channel one line delay 1440×8 again using only the D2OUT, a 1440×8 one or two line delay by connecting the lower eight bits of D2OUT which are the one line delayed data to the upper eight bits of DIN, and using the upper eight bits of D2OUT as the two line delayed data, and a 2880×8 one line delay by connecting as stated for the previous configuration and using only the upper eight bits of D2OUT as the one line delayed output. Finally, the invention is not limited to the application of a video line delay of any specific length, and can also be employed in other digital applications (for example in a digital filtering) that require a bit stream be delayed or stored for a period of time. Another possible application is the use of the architecture as a first-in first-out (FIFO) buffer.

What is claimed is:

1. An apparatus comprising:

a storage unit including a plurality of line stores each having a plurality of word storage locations (n), each of said word storage locations including a plurality of memory cells, wherein corresponding memory cells from each of said word storage locations are connected to common input lines of said line stores and common output lines of said line stores and each of said word storage locations includes a corresponding write enable line and a corresponding read enable line connected to the memory cells within that word storage location, and wherein the read and write enable lines of corresponding word storage locations in each of said line stores are commonly coupled, and the common output lines of a given line store are coupled to the common input lines of a successive line store; and a point unit including a plurality of shift-registers (N+1) having input lines and output lines, wherein the input line of a first shift-register of said plurality of shift-registers is connected to a control input line and the output of said first shift-register is connected to the read enable line of a first word storage location of said plurality of word storage locations, the output line of a last shift-register of said plurality of shift-registers is connected to the write enable line of a last word storage location, and shift-registers intermediate between said first shift-register and said last shift-register are connected such that the output line of a preceding shift register is connected to the input line of a successive shift-register and the output of each intermediate shift register (i) is connected to the read enable line of a corresponding word storage location (i) and to the write enable line of a word storage location (i−1) preceding said corresponding word storage location;

wherein said plurality of word storage locations are arranged in a plurality of columns, corresponding memory cells from word storage locations within a given column are connected to common column output lines, and corresponding column output lines from each of said plurality of columns are connected to a corresponding multi-input NAND gate that selectively couples data presented on one of the corresponding column output lines connected thereto to a data output line soley in response to data stored in said plurality words storage locations.

2. An apparatus as claimed in claim 1, wherein each of said plurality of shift-registers includes a reset device coupled to a reset line.

3. An apparatus as claimed in claim 1, wherein said memory cells comprise dynamic random access memory (DRAM) cells.

4. An apparatus is claimed in claim 3, wherein said DRAM cells comprise three-transistor DRAM cells.

5. An apparatus as claimed in claim 3, further comprising precharge circuitry coupled to said DRAM cells, write circuitry coupled to the common input lines of said line stores, read circuitry coupled to the common output lines of said line stores, and clocking circuitry coupled to said write circuitry, said read circuitry and said pointer unit.

6. An apparatus comprising:
storage means for storing a plurality of data words in a plurality of word storage memory locations, said storage means including a plurality of read enable lines and a plurality of write enable lines coupled to corresponding word storage memory locations, wherein said plurality of word storage locations are arranged in a plurality of columns, each column including a plurality of input lines and data output lines;
pointer means for addressing the read enable lines and the write enable lines of said plurality of word storage memory locations, wherein said pointer means sequentially addresses the read enable line of a first word storage memory location, the read enable line (Ri) of each intermediate word storage memory location and the write enable line (Wi−1) of a word storage memory location immediately preceding each intermediate word storage memory location, and the write enable line of a last word storage memory location;
write means for writing data into each of said plurality of word storage memory locations when a corresponding write enable line is addressed by said pointer means;
read means for sensing data from each of said plurality of word storage means when a corresponding read enable line is addressed by said pointer means;
clocking means for supplying synchronizing signals to said pointer means, said read means and said write means, and
multiplexing means, including a plurality of NAND gates, coupled to the data output lines of each of said plurality of columns for multiplexing the data presented on corresponding data output lines from said plurality of columns, wherein said corresponding data output lines are connected to a corresponding NAND gate of said plurality of NAND gates and said corresponding NAND gate selectively couples data presented on one of said corresponding data output lines connected thereto to its output line.

7. An apparatus as claimed in claim 6, further comprising means for resetting said pointer means at a desired line length.

8. An apparatus as claimed in claim 6, wherein said data words are sequentially written in said storage means by said write means and are read from said storage means by said read means such that the first data word written in said storage means is the first data word read from said storage means.

9. An apparatus comprising:
storage means for storing a plurality of data words in a plurality of word storage memory locations, said storage means including a plurality of read enable lines and a plurality of write enable lines coupled to corresponding word storage memory locations;
pointer means for addressing the read enable lines and the write enable lines of said plurality of word storage memory locations, wherein said pointer means sequentially addresses the read enable line of a first word storage memory location, the read enable line (Ri) of each intermediate word storage memory location and the write enable line (Wi−1) of a word storage memory location immediately preceding each intermediate word storage memory location, and the write enable line of a last word storage memory location;
write means for writing data into each of said plurality of word storage memory locations when a corresponding write enable line is addresses by said pointer means;
read means for sensing data from each of said plurality of word storage means when a corresponding read enable line is addresses by said pointer means;
clocking means for supplying synchronizing signals to pointer means, said read means and said write means;
wherein said plurality of word storage locations are divided into at least first and second line stores, each of said first and second line stores having a plurality of data input lines and data output lines, the data output lines of said first line store are coupled to the input data lines of said second line store, and said first and second line stores are divided into at least first and second columns, each of said first and second columns having a plurality of column output data lines; and
multiplexing means for multiplexing data presented on corresponding column output data lines from said first and second columns of said first and second line stores to said data output lines of said first and second lines stores, respectively, wherein said multiplexing means includes a plurality of multi-input NAND gates, corresponding column output data lines are connected to a corresponding NAND gate of said plurality of NAND gates, and said corresponding NAND gate selectively couples data presented on one of said corresponding column output data lines to its output solely in response to data stored in said plurality of word storage locations.

* * * * *